United States Patent
Tsuno et al.

[11] Patent Number: 5,427,053
[45] Date of Patent: Jun. 27, 1995

[54] DIAMOND FILM AND METHOD OF PRODUCING SAME

[75] Inventors: Takashi Tsuno; Naoji Fujimoro, both of Hyogo, Japan

[73] Assignee: Sumitomo Electric Industries, Ltd., Osaka, Japan

[21] Appl. No.: 936,838

[22] Filed: Aug. 28, 1992

[30] Foreign Application Priority Data

Aug. 30, 1991 [JP] Japan ................... 3-246718

[51] Int. Cl.$^6$ ........... C30B 25/02; C30B 25/18; C30B 25/22
[52] U.S. Cl. ........... 117/88; 117/90; 117/929; 427/249; 264/81
[58] Field of Search ........... 156/DIG. 68, 610, 613; 427/249, 248.1; 264/81; 423/446; 117/88

[56] References Cited

U.S. PATENT DOCUMENTS

| | | | |
|---|---|---|---|
| 4,997,636 | 3/1991 | Prins | 423/446 |
| 5,114,745 | 5/1992 | Jones | 427/113 |
| 5,130,111 | 7/1992 | Pryor | 423/446 |
| 5,180,571 | 1/1993 | Hosoya et al. | 423/446 |
| 5,183,529 | 2/1993 | Potter et al. | 156/613 |

FOREIGN PATENT DOCUMENTS

| | | |
|---|---|---|
| 0378378 | 7/1990 | European Pat. Off. . |
| 0417924 | 3/1991 | European Pat. Off. . |
| 03126697 | 5/1991 | Japan . |

OTHER PUBLICATIONS

Suzuki et al, "Expitaxial Growth of Diamond on C-BN Surface", The Third Diamond Symposium 1989, no month available.

M. Fujita et al, "Expitaxial Growth of Diamond on Nickel Substrate", The Fourth Diamond Symposium 1991, no month available.

Chang et al, "Diamond crystal growth by plasma chemical vapor deposition", Journal of Applied Physics, vol. 63, No. 5, Mar. 1988, pp. 1744–1748.

Koizumi et al, "Epitaxial growth of diamond thin films on cubic boron nitride (111) surfaces by dc plasma chemical vapor deposition", Applied Physics Letters, vol. 57, No. 6, Aug. 1990, pp. 563–565.

*Primary Examiner*—Shrive Beck
*Assistant Examiner*—Bret Chen
*Attorney, Agent, or Firm*—Cushman Darby & Cushman

[57] ABSTRACT

A method for making a quasi-single crystal diamond is provided. Small diamond granules, like islands, are epitaxially grown on a single crystal substrate having a lattice constant which is similar to that of diamond. A deposition layer is formed on the island diamond granules. The initial substrate is eliminated. Diamond is grown on the deposition layer having diamond granules to make a diamond film having a certain thickness. The initially-grown diamond granules which have the same crystallographical direction align the direction of crystals of the latter-grown diamond by playing a role of seed crystals.

5 Claims, 4 Drawing Sheets

DIAMOND FILM AND METHOD OF PRODUCING SAME

FIELD OF THE INVENTION

This invention relates to a diamond film of good crystallographical property and a method of producing same.

BACKGROUND OF THE INVENTION

This application claims the priority of Japanese Patent Application No. 248718/1991 filed Aug. 30, 1991, which is incorporated herein by reference.

Diamond is endowed with wide applications. In general, diamond tools have been made from sintered diamond polycrystalline diamond hitherto. Besides tools, diamond is going to be utilized as a material or semiconductor for making electronic devices. Such diamond as a material for electronic devices requires to be a single crystal. Polycrystalline diamond is useless in the field of electronic devices, because grain boundaries in polycrystals reduce the mobility of carries and prevent the formation of a good pn-junction. Since a polycrystal is an assembly of a plurality of small single crystals, contains many grain boundaries which are surfaces of the small single crystals. Grain boundaries scatter electrons and holes and impair pn-junctions, for example low breakdown voltage in a reverse direction, high resistance in a forward direction. Elimination of such bad effects caused by grain boundaries of polycrystals requires an epitaxial growth of diamond.

Only a single crystal diamond substrate allows the growth of a diamond film epitaxially thereon. This is homoepitaxy. There Is no problem of lattice mismatch due to the difference of lattice constants or difference of thermal expansion coefficients. However, a diamond substrate itself is expensive and difficult to produce. It will be indispensable to grow a diamond film on another material besides diamond for responding to wide applications of diamond. However, it is difficult to grow a diamond film epitaxially on a material different from diamond. The difficulty of heteroepitaxy (epitaxial growth on a non-diamond material) is a great problem to be solved for exploiting excellent properties of diamond.

At present, no report: except a heteroepitaxy on a c-BN substrate by Suzuki has been issued so far. SUZUKI et al., THE THIRD DIAMOND SYMPOSIUM, 1989 proceeding text, p75.

Suzuki reported that a diamond is epitaxially grown on a c-BN (cubic boron nitride) substrate. This was a first success of heteroepitaxy of diamond. However, a c-BN substrate is not easily produced. Synthesis under high pressure is only an applicable method for producing a c-BN substrate at present. The synthesis of c-BN is as difficult as that of diamond. Thus, the heteroepitaxy on a c-BN substrate is not a practical method of producing an epitaxial diamond film. The diamond/c-BN heteroepitaxy was not a breakthrough in epitaxy of diamond. Even now there is no practical, useful method of growing diamond epitaxially on a practical substrate which can be easily obtained at low costs.

Fujita et al. reported a nickel (Ni) substrate to grow an assembly of diamond islands epitaxially thereon. Nickel has a lattice constant similar to that of diamond. FUJITA et al., THE FOURTH DIAMOND SYMPOSIUM, 1991, proceeding text. p13.

However, Fujita's diamond was not a compact film. It was essentially an assembly of islands of diamond. The epitaxy meant that the crystallographical direction of the islands coincided with that of the substrate. Many diamond islands were sparsely populated on a (001)Ni substrate or a (111)Ni substrate in Fujita's diamond fi lra.

Further deposition on the islands would not result in a hole-free film. The reason is that erosion of diamond by the nickel substrate is inevitable during further deposition. No compact film of diamond could be obtained by the further deposition. The sparsely populated islands did not mean the shortage of deposition. The further deposition would force the initially epitaxially grown islands to vanish in the substrate. Although nickel is one of the most favorable materials for a substrate of diamond epitaxy because of the lattice constant being nearly equal to that of diamond, a nickel substrate does not allow depositing a compact diamond film thereon.

In the long run, diamond is the most suitable material for a substrate of diamond epitaxy. Synthesis of a wide diamond single crystal is difficult at present. But polycrystalline diamond can be easily synthesized by the technology of the state of art. Gels proposed a method for producing diamond films which have nearly the same crystallographical direction by arraying small diamond single crystals in a common direction, and synthesizing diamond films on the arranged small diamond granules having the same crystallographical direction. M. W. GEIS & H. I. SMITH; SPRING MEETING OF ELECTROCHEMICAL SOCIETY, WASHINGTON, D.C.

Gels et al. dicloses a method to make a compact mosaic diamond film having the same direction. But it is very difficult to exclude grain boundaries with a small angle of some 1 degree in Geis's method.

In order to solve the above problems, this invention has been devised. A purpose of this invention is to provide a wide, compact diamond film having a good crystallographical property and an aligned crystallographical direction. Another purpose of this invention is to provide a method of producing a wide, compact diamond film having a good crystallographical property. Another purpose of this invention is to provide a low cost method for producing a wide, compact diamond film. Another purpose of this invention is to provide a method of epitaxial growth of diamond without using a diamond substrate.

SUMMARY OF THE INVENTION

A method of this invention comprises the steps of growing islands of diamond on a first single crystal substrate of non-diamond material epitaxially, depositing a second material on the first substrate for covering the islands of diamond, eliminating the first substrate from the second material including the islands of diamond, revealing the islands of diamond and growing diamond on the revealed islands of diamond.

Preferably, the first substrate should be a single crystal Ni or NiCu substrate. Ni or NiCu has a lattice constant similar to that of diamond. Single crystal is required in order to grow diamond granules epitaxially thereon. If the substrate was polycrystalline, the crystallographical directions of granules deposited on the polycrystalline substrate would be distributed at random. Such an assembly of the randomly-oriented granules could not be a substrate for a near-single-crystalline film.

It is preferable that silicon shall be deposited on the first substrate and diamond granules. The deposition material (the second material) need not be a single crystal, since it plays only a role of a temporarily holding diamond granules. Other materials can be employed for the second material, for example metals or glass besides silicon.

The first substrate must have a lattice constant nearly equal to that of diamond. Similar lattice constants enable diamond to grow epitaxially on the first substrate. But the grown diamond is an assembly of islands of diamond. The diamond granules have the same crystallographical direction. But they are isolated from each other. The deposition layer has two roles. One is to fix the location of the diamond granules. The other is to grow a compact diamond film. Although the diamond produced by this invention is not a single crystal in the strict sense of the word, it is nearly equivalent to a single crystal.

This invention makes a compact, thick diamond film which is an assembly of crystals having the same crystallographical direction by growing diamond islands epitaxially on a first single crystal substrate, covering the islands and the substrate with a deposition layer, for example Si, eliminating the first substrate to make the island diamonds appear to a common surface, and growing a thick diamond epitaxially on the diamond granules. Since the directions of the diamond granules are aligned in order, the diamond crystals which construct the thick diamond layer are also aligned in order. A wide, compact diamond film of a good crystalline property is obtained. The film is an assembly of many single crystals which have the same crystallographical direction. Due to a good crystalline property, the diamond can be made use of in various fields of technology.

In general, for example the diamond made by this invention has a deposited material, e.g. Si on the rear surface of the film as a plate. In some purposes, such a diamond plate can be used as it is. If the lining material on the rear surface is undesirable, the lining material (second material) should be eliminated by polishing or etching.

DETAILED DESCRIPTION OF THE PREFERRED EMBODIMENTS

FIG. 1 to FIG. 4 demonstrate the steps of producing diamond according to this invention. As mentioned before, some single crystal substrates allow diamond to grow epitaxially into islands thereupon, for example a nickel (Ni) substrate or a nickel copper (NiCu) substrate. For example, island diamond can be grown epitaxially on a Ni single crystal. The diamond granules are island-like, i.e. isolated from each other. But the granules have grown epitaxially on the substrate. The granules have the same crystallographical direction. As demonstrated in FIG. 1, many small diamond granules are grown on a single crystal substrate (1) in an epitaxial manner.

Some materials, for example silicon can be deposited on the substrate (1) sparsely populated with diamond granules (2). In this case, a silicon layer is produced thereon by vacuum evaporation, sputtering or CVD methods.

Figure 1:
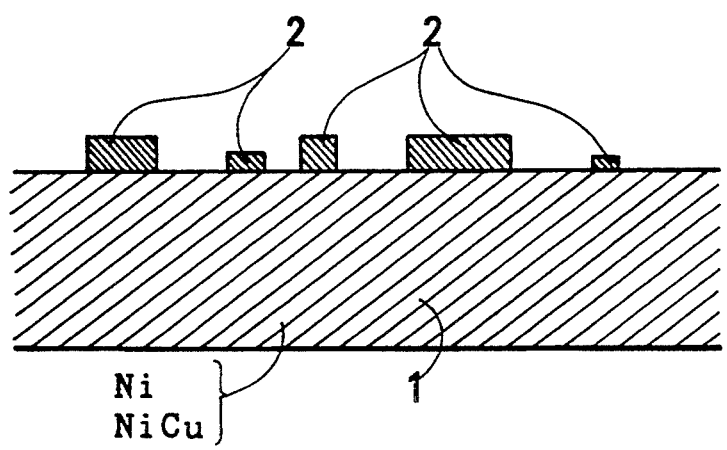
FIG. 1 is a cross section of a nickel single crystal substrate on which small diamond granules are grown epitaxially.
Figure 2:
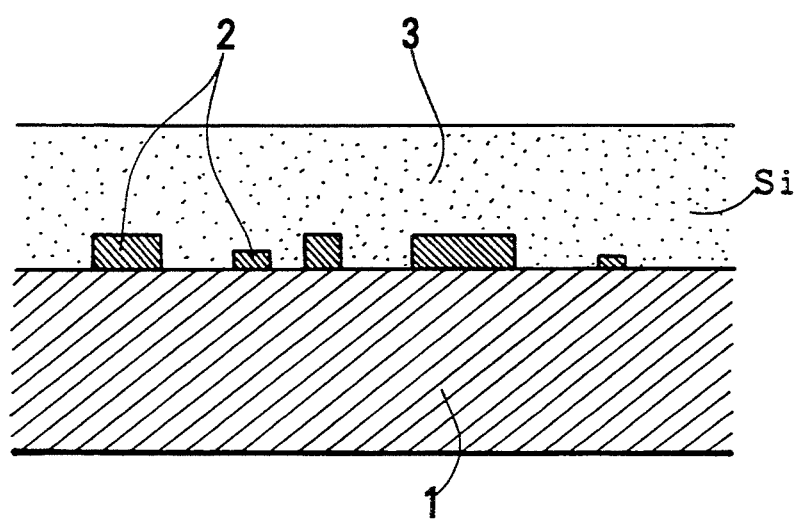
FIG. 2 is a cross section of the single crystal substrate with diamond granules evaporated with silicon.
Figure 3:
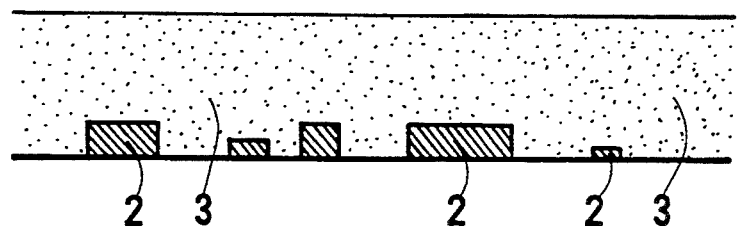
FIG. 3 is a cross section of a silicon deposition layer distributed with diamond granules from which the nickel substrate has been eliminated.

As exhibited in FIG. 2, part of the silicon deposition layer (3) is in contact with the single crystal substrate (1). The Si deposition layer (3) fully covers the diamond granules (2). Thus, the diamond granules (2) are sandwiched between the single crystal substrate (1) and the Si deposition layer (3). The small diamond granules buried in the Si deposition layer (3) are isolated from each other, but the crystallographical directions of them are common because they have been epitaxially deposited on a single crystal.

This is important. The first single crystalline substrate (1) has a role of making the directions of diamond granules line up in a certain direction. The role of the first single crystal substrate is arranging diamond granules growing thereon in a common direction. The deposition layer (3) plays a role of fixing the location of many small diamond granules arranged in order. As the temporal fixation of granules is the main object of making the deposition layer (3), the deposition layer (3) can be constructed by a single crystal, a polycrystal or amorphous material. Other materials besides silicon can be used. Any material which will not be eliminated at elimination of the substrate by etching and will be likely to deposit on a substrate can be used. The lattice constant of the deposition layer (3) is not necessarily similar to that of the substrate (1).

Next, the single crystalline substrate (1) is eliminated both from the deposition layer (3) and from the distributed small diamond granules (2). Elimination of the substrate (1) can be done by either chemical etching or physical polishing. The Si deposition layer (3) remains after the elimination. Many small diamond granules remain on the lower surface of the deposition layer (3). Fresh surfaces are revealed on the polished diamond granules.

Then, diamond will be grown on the revealed surface of the diamond granules (2) in vapor phase. Unlike the growth on a Ni plate, a compact film of diamond can easily be deposited on a silicon substrate. Since the growth essentially occurs on a silicon substrate, a compact film can be synthesized. The small diamond granules buried in the Si deposition layer determine the crystallographical directions of diamond growing thereon as seed crystals. Therefore, newly deposited diamonds have the same direction as the small diamond granules (3). Since all the diamond granules are endowed with the same crystallographical direction, newly-growing diamonds have the same direction.

Namely, a silicon substrate can make a compact film of diamond but it cannot grow alignment in epitaxy. On the contrary, a nickel or nickel copper substrate allows diamond to grow epitaxially, although no compact film can be deposited on them.

Figure 4:
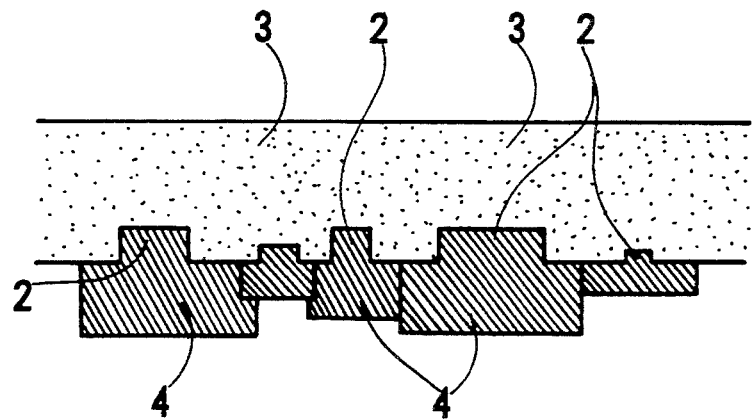
FIG. 4 is a cross section of a thick diamond layer grown on the revealed surfaces of the granules of diamond.
Figure 5:
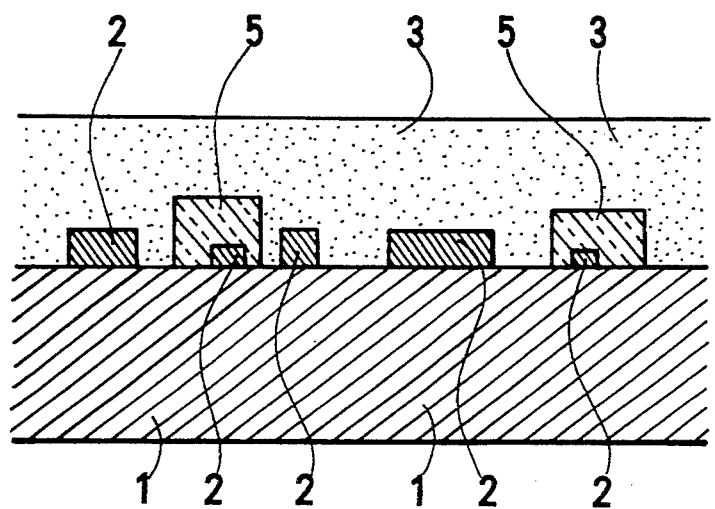
FIG. 5 is a cross section of a nickel substrate on which diamond granules have been grown and aluminum has been deposited on selective areas for covering some granules of diamond and on which silicon has been evaporated.

However, not a single crystal but an assembly of many small crystals is used as a seed crystal. The epitaxially-grown diamond film has many defects, e.g. stacking faults. FIG. 4 demonstrates such a state. Some applications allow such defect-populated diamond for use. In this case, the diamond with defects shall be polished and utilized for optical windows or a material of electronic devices. This is a complex substrate in strata including diamond part and a silicon deposition layer. This substrate can be applied to a substrate of diamond semiconductor devices.

Other applications may require no defaults or few defaults in the diamond substrate. Stacking defaults have been originated by the mismatch of the positions of the initially-deposited diamond granules due to the differences of phases of the granules in a crystal structure. The initially-deposited diamond granules have the same direction, since they have grown epitaxially. But they lack coincidence of phase of the lattice structure. The more the number of the initially deposited diamond granules become, the higher the defect density raises. Thus, decrease of the number of the initial diamond nuclei contributes to decrease of defect density in the diamond layer grown on the seed granules.

Figure 6:
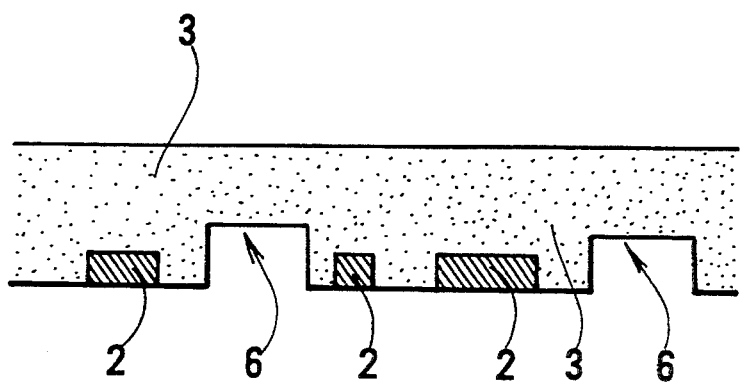
FIG. 6 is a cross section of the silicon deposition layer including diamond granules from which the nickel single crystal substrate has been eliminated by acid, being accompanied by the elimination of aluminum patterns.

Alleviation of diamond nuclei will be done by the following two methods;

1 First method comprising the steps of growing many small diamond granules on the first substrate (Ni, Cu or NiCu substrate) epitaxially and evaporating a metal, for example Al, Ni, Cu, Fe, etc. which can be etched away by acid selectively in patterns. Some portions of diamond granules are covered with the selectively coating metal (5). The other portions of diamond granules are left uncovered and isolated. When silicon is deposited on them, the uncovered, isolated granules become enclosed by the silicon deposition layer (3) and are fixed by the deposition layer (3). The other granules (2) covered with the metal are not in contact with silicon (Si). Then, the substrate (1) is eliminated for example by acid. Removal of the metal (5) accompanies the elimination of the substrate (1). The diamond granules enclosed by the metal (5) are also eliminated at the same time. What remains in the long run is isolated diamond granules which have not been covered with the metal patterns as shown in FIG. 6. The spot on which an aluminum pattern deposited becomes a hole pattern (6) from which the diamond granule has been removed. The number of diamond granules has been reduced. Reduction of the granules is in proportion to the sum of areas of the covering metal patterns. Since the density of the diamond nuclei is reduced, the probability of occurrence of stacking defaults is diminished. This method enables one to designate the spots from which diamond granules shall be eliminated and the other spots in which granules shall remain by selecting patterns of the metal layer (5). Therefore, the distribution of diamond nuclei can be arbitrarily determined by patterning of the metal. A free choice of pattern allows one to make a uniform generation of nuclei which will produce a uniform diamond film with few defaults.

Figure 7:
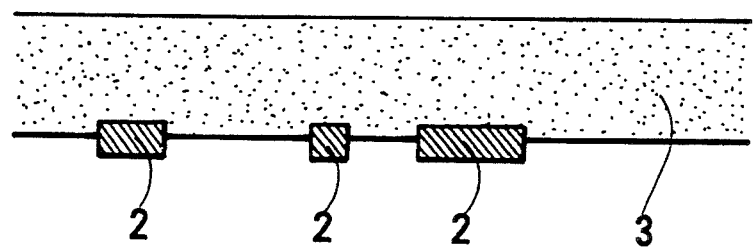
FIG. 7 is a cross section of the silicon deposition layer which is slightly etched at the front surface including diamond granules.

2 Second method comprising the steps of growing many small diamond granules, eliminating the first substrate (1) ( Ni, Cu or NiCu substrate) and slightly etching the silicon deposition layer (3) on the surface on which diamond granules are buried. FIG. 7 shows the deposition layer etched by the process. The deposition layer (3) uniformly becomes thinner. Sizes of diamond granules fluctuate randomly. Some granules are large and other granules are small. Etching of the deposition layer (3) reveals the bottoms of smaller granules. Such smaller granules are removed with silicon in the deposition layer (3). Larger granules having sturdy roots in the deposition layer (3) remain as they are. The etching lowers the density of diamond granules which become nuclei of epitaxial growth. Reduction of the initial density of nuclei alleviates the occurrence of stacking defaults. This method cannot determine the distribution of diamond granules, since the distribution of sizes of granules is determined by chance. However, this method has an advantage of simplified steps. The second method is more feasible than the first one.

EMBODIMENT 1

Diamond was grown on a (001)Ni substrate with a 0.2 mm thickness by a microwave plasma CVD method under the conditions:

material gas . . . hydrogen gas ($H_2$)
methane gas ($CH_4$)
methane concentration = 2 vol %
temperature of substrate . . . 950° C.
time of growth . . . 1 hour After the growth, the surface of the Ni substrate was observed by a scanning electron-microscope. The surface was sparsely populated with small diamond granules like islands in the sea. Maximum size of island diamond was 1 μm. Sizes widely fluctuated, but shapes of the diamond islands were mainly rectangular or square which reflected the crystallographical property of the substrate. Directions of the granules were aligned in order. An observation by an RHEED (Reflection High Energy Electron Diffraction) certified that the diamond granules have grown epitaxially on the nickel substrate.

Silicon was evaporated on the surface having the diamond granules into a film with a thicknesses of 0.1 mm at a temperature of 300° C. When the silicon was evaporated to the substrate at room temperature, the silicon deposition layer was partially peeled. A substrate temperature higher than 200° C. allowed silicon to deposit on the substrate without peeling. An RHEED observation of the silicon deposition layer (3) revealed amorphous growth of silicon. FIG. 2 shows the substrate.

The sample was etched by nitric acid. The nickel substrate (1) was dissolved away. Silicon remained unetched. The small diamond granules were revealed on the surface of the silicon deposition layer. An RHEED observation of the surface on which diamond granules were buried revealed regular lattice reflection of diamond periodic lattice in order and halo patterns of amorphous silicon (a-Si).

Then, diamond was grown on the surface of the sample on which diamond granules were buried by a microwave plasma CVD apparatus. The conditions of CVD method were as follows:
material gas . . . hydrogen gas ($H_2$)
methane gas ($CH_4$)
methane concentration = 4 vol %
temperature of substrate . . . 830° C.
time of growth . . . 30 hours A compact diamond film with a thickness of 22 $\mu$m was obtained. Measurement of the intensity of RHEED patterns exhibited that the film was a diamond film with more than 99% of the granules having the same crystallographical direction.

EMBODIMENT 2

Diamond was grown on two (111)NiCu substrates with a thickness of 0.3 mm by a filament CVD method under the conditions:
material gas . . . hydrogen gas ($H_2$)
methane gas ($CH_4$)
methane concentration = 1 vol %
temperature of substrate . . . 930° C.
time of growth . . . 2 hours After the growth, the surface of the substrate was observed by a scanning electron-microscope. Small granules of a maximum diameter of 0.5 $\mu$m were, sparsely populated on the surface like islands in the sea. Shapes of the granules were triangles which reflected the crystallographical property of the substrate. The directions of the triangle granules were in aligned order. An observation of RHEED patterns proved that the diamond granules were epitaxially grown on the NiCu substrate.

Figure 8:
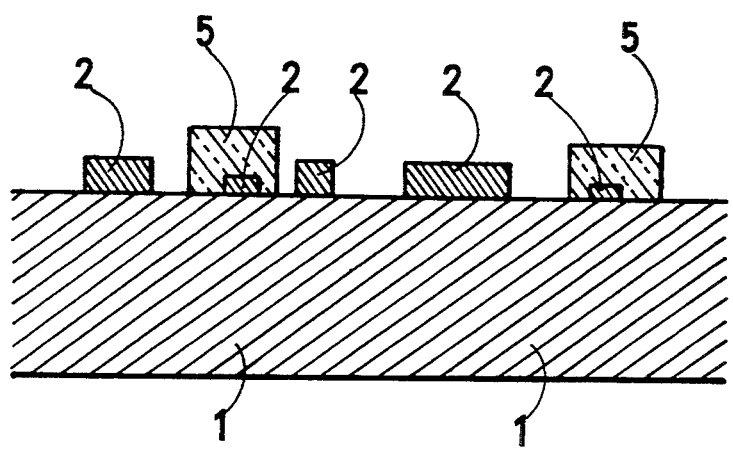
FIG. 8 is a cross section of a single crystalline substrate on which diamond granules have epitaxially been grown and aluminum patterns have been deposited on selective areas

There were two equivalent samples. One sample (first sample) was healed up to a temperature of 200° C. and was selectively covered with aluminum in patterns as shown in FIG. 8. The aluminum layer can be formed by sputtering or electron beam evaporation. The thickness of the aluminum layer was 2 $\mu$m. The thickness of the aluminum should be determined to cover all of the granules. In this case, since the maximum diameter of granules was 0.5 $\mu$m, a thickness of 2 $\mu$m was quite enough to cover the granules. The other sample (second sample) was immune from an aluminum coating. The second sample without an aluminum layer and the first sample with an aluminum layer were treated according to the same steps hereafter.

Silicon was evaporated on two substrates to the surface having the diamond granules to a thickness of 0.1 $\mu$m. For example, electron beam evaporation can be used. The substrate was kept at a temperature of 400° C. Low temperature of substrate was likely to peel a part of the silicon layer from the substrate. The temperature of the substrate must be higher than 200° C.

Then, the samples were etched by nitric acid. In the First sample, the first substrate (NiCu) and the aluminum layer were dissolved away, as shown in FIG. 6. In the second sample, only the NiCu substrate was dissolved away. The surfaces on which the diamond granules were buried were observed by a scanning electron-microscope. The first sample (on which the aluminum patterns had been formed) had diamond granules only on the part where no aluminum pattern had been formed. The second sample had diamond granules overall.

Diamond was grown on the surfaces where diamond granules existed by a microwave plasma CVD method under the conditions:
material gas . . . hydrogen gas ($H_2$)
methane gas ($CH_4$)
methane concentration = 1 vol %
temperature of substrate . . . 840° C.
time of growth . . . 50 hours A compact diamond film with a thickness of 30 $\mu$m was obtained. The diamond film with the silicon deposition layer can be used as it is for some purposes. Otherwise, the silicon deposition layer shall be eliminated for another purposes. Then, the silicon layers of the two were etched away by hydrofluoric acid. Without the rigidity of the silicon layer, the diamond films could keep the shape by themselves.

Defect densities of both samples were measured by an X-ray topography apparatus. The defect density of the first sample (Al evaporated) is one fifth of that of the second sample (without Al evaporation). This measurement proved that the decrease of diamond granules which will be nuclei of crystal growth alleviates the defect density.

The method of this invention makes a compact, thick diamond film which is an assembly of single crystals having the same crystallographical direction by growing diamond islands epitaxially on a first single crystal substrate, covering the islands and the substrate with a deposition layer, for example Si, eliminating the first substrate, and growing further a thick diamond layer epitaxially on the diamond granules. Since the directions of the initially-grown diamond granules are aligned in order, the diamond crystals which construct the thick diamond layer are also aligned in order. This invention allows one to make a wide, compact diamond film having a crystallographical direction in order and having a good crystal line property. Although it is not a single crystal, it is similar to a single crystal. A good crystalline property enables the diamond films to be a material of diamond semiconductor of electronic devices. The diamond can be converted to a semiconductor material with low resistivity by doping it with pertinent impurities. P-type diamond and n-type diamond can be produced by doping impurities. Active semiconductor devices can be fabricated by the diamond prepared by this invention. The property of the diamond made by the teaching of this invention is nearly equivalent to a single crystal diamond. Although the crystal contains many grain boundaries, the scattering by the boundaries far less than that by the ordinary polycrystalline diamond. Thus the carrier mobility is raised.

What we claim is:

1. A method for producing a diamond film comprising the steps of:
    growing epitaxially diamond granule islands on a single crystal substrate, said single crystal substrate having a lattice constant sufficiently similar to the lattice constant of diamond for said epitaxial diamond granule islands to be grown;
    forming a deposition layer on the diamond granules and the single crystal substrate;
    eliminating the single crystal substrate until a surface of the deposition layer including the diamond granules is revealed; and growing epitaxially a diamond film on the surface of the deposition layer including the diamond granules.

2. A method for producing a diamond film comprising the steps of:

growing epitaxially diamond granule islands on a single crystal substrate of Ni, Cu or NiCu by a vapor phase method;

forming a deposition layer of Si on the diamond granules and the single crystal substrate in order to sandwich the diamond granules between the single crystal substrate and the deposition layer;

eliminating the single crystal substrate until a surface of the deposition layer including the diamond granules is revealed; and synthesizing a diamond film by growing diamond on the surface of the deposition layer including the diamond granules.

3. A method of producing a diamond film comprising the steps of:

growing epitaxially diamond granule islands on a single crystal substrate of Ni, Cu, or NiCu by a vapor phase method;

forming metal patterns of Al, Ni, Cu or Fe selectively on the single crystal substrate in order to cover some of the diamond granules with the metal patterns;

forming a deposition layer on the diamond granules, the metal patterns and the single crystal substrate in order to sandwich the diamond granules and metal patterns between the single crystal substrate and the deposition layer;

eliminating the single crystal substrate until a surface of the deposition layer including the diamond granules is revealed; and synthesizing a diamond film by growing diamond on the surface of the deposition layer including the diamond granules.

4. A method for producing a diamond film comprising the steps of:

growing epitaxially diamond granule islands on a single crystal substrate of Ni, Cu or NiCu by a vapor phase method;

forming a Si deposition layer on the diamond granules and the single crystal substrate in order to sandwich the diamond granules between the single crystal substrate and the Si deposition layer;

eliminating the single crystal substrate until a surface of the deposition layer including the diamond granules is revealed;

etching the surface of the deposition layer including the diamond granules in order to reduce the number of diamond granules; and synthesizing a diamond film by growing diamond on the surface of the deposition layer including the diamond granules.

5. A method of producing a diamond film comprising the steps of:

growing epitaxially diamond granule islands on a single crystal substrate, said single crystal substrate having a lattice constant sufficiently similar to the lattice constant of diamond for said epitaxial diamond granule islands to be grown;

forming a deposition layer on the diamond granules and the single crystal substrate in order to sandwich the diamond granules between the single crystal substrate and the deposition layer;

eliminating the single crystal substrate until a surface of the deposition layer including the diamond granules is revealed;

synthesizing a diamond film by growing diamond on the surface of the deposition layer; and eliminating the deposition layer in order to obtain a diamond film having no other materials.

* * * * *